United States Patent [19]
Tustaniwskyj et al.

[11] Patent Number: 6,042,388
[45] Date of Patent: Mar. 28, 2000

[54] ELECTROMECHANICAL MODULE HAVING A THIN SPRINGY PLATE FOR ESTABLISHING PRESSED ELECTRICAL CONNECTIONS

[75] Inventors: Jerry Ihor Tustaniwskyj, Mission Viejo; Leonard Harry Alton, Escondido, both of Calif.

[73] Assignee: Unisys Corporation, Blue Bell, Pa.

[21] Appl. No.: 09/234,270

[22] Filed: Jan. 19, 1999

[51] Int. Cl.[7] ...................................................... H01R 9/09
[52] U.S. Cl. .............................. 439/66; 439/67; 439/71; 439/74
[58] Field of Search .................. 439/66, 67, 71, 439/73, 74, 68, 69, 331

[56] References Cited

U.S. PATENT DOCUMENTS

| | | | |
|---|---|---|---|
| 3,942,854 | 3/1976 | Klein et al. ......................... | 339/17 CF |
| 5,127,837 | 7/1992 | Shah et al. ................................. | 439/71 |
| 5,155,905 | 10/1992 | Miller, Jr. .................................. | 29/843 |
| 5,259,781 | 11/1993 | Baumberger et al. .................. | 439/362 |
| 5,315,481 | 5/1994 | Smolley ................................... | 361/707 |
| 5,730,620 | 3/1998 | Chan et al. .............................. | 439/526 |
| 5,785,535 | 7/1998 | Brodsky et al. .......................... | 439/73 |
| 5,881,453 | 3/1999 | Avery et al. .............................. | 29/834 |

*Primary Examiner*—Lincoln Donovan
*Assistant Examiner*—Richard K. Lee
*Attorney, Agent, or Firm*—Charles J. Fassbender; Mark T. Starr; Steven B. Samuels

[57] ABSTRACT

An electromechanical module with pressed electrical connections includes the following components: 1) a printed circuit board having a first array of I/O pads; 2) a substrate having a second array of I/O pads that are aligned with and face the first array of I/O pads; 3) compressible electrical contacts which lie between the first and second array of I/O pads; 4) a thin springy plate having a central section which presses against the printed circuit board in line with the first array of I/O pads, and having a springy periphery that extends in a quiescent state away; from the printed circuit board; and 5) a compressing means which compresses the electrical contacts by forcing the substrate towards the printed circuit board while bending the springy periphery of the thin-springy plate towards the substrate. When the plate is in a state where the electrical contacts are fully compressed, the thin-springy plate is relatively flat; and thus, the module has a low profile. Maximum deflection and stress in the printed circuit board are kept below an acceptable limit by selecting the particular locations where the central section of the thin springy plate presses against the board.

15 Claims, 8 Drawing Sheets

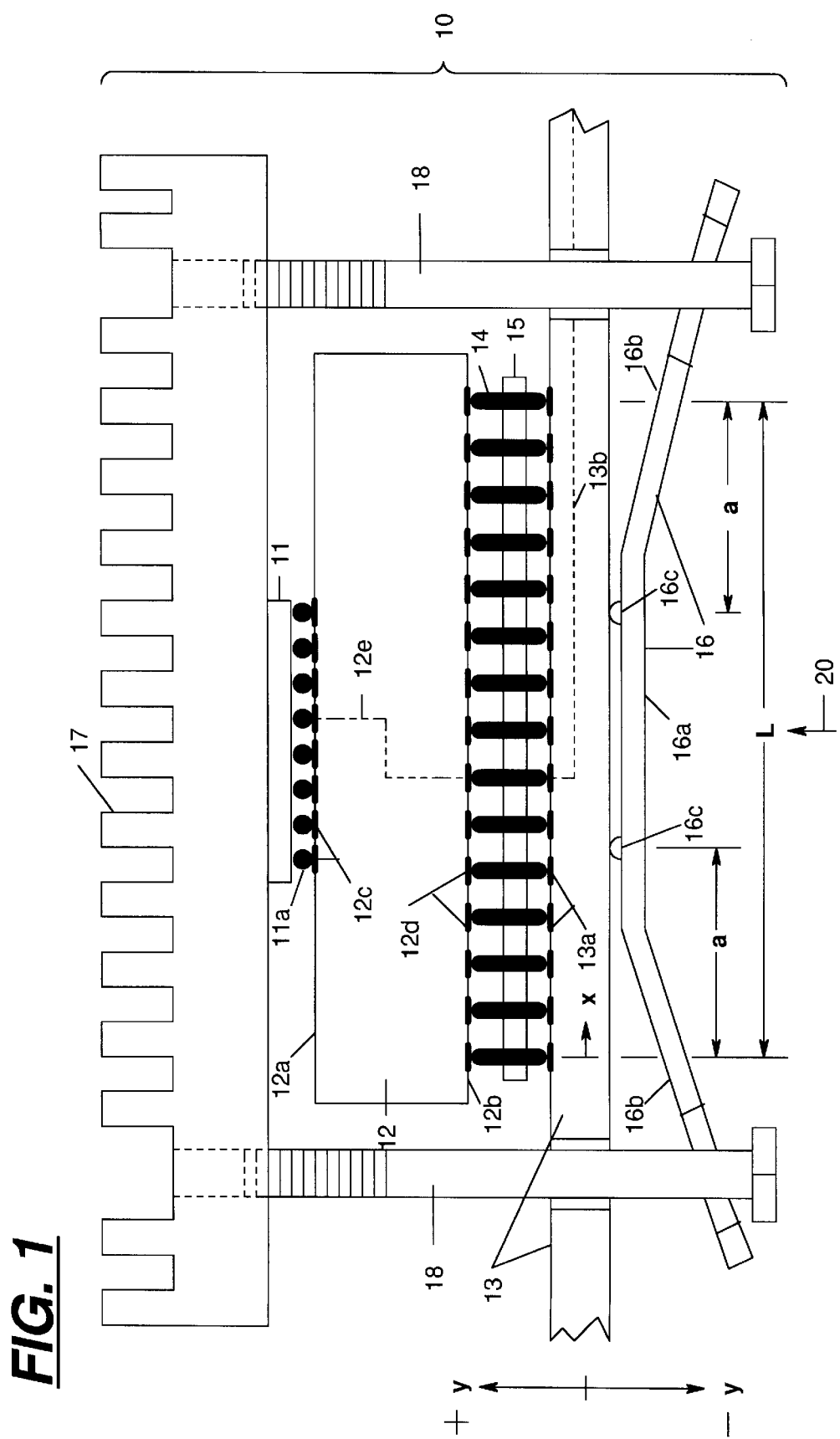

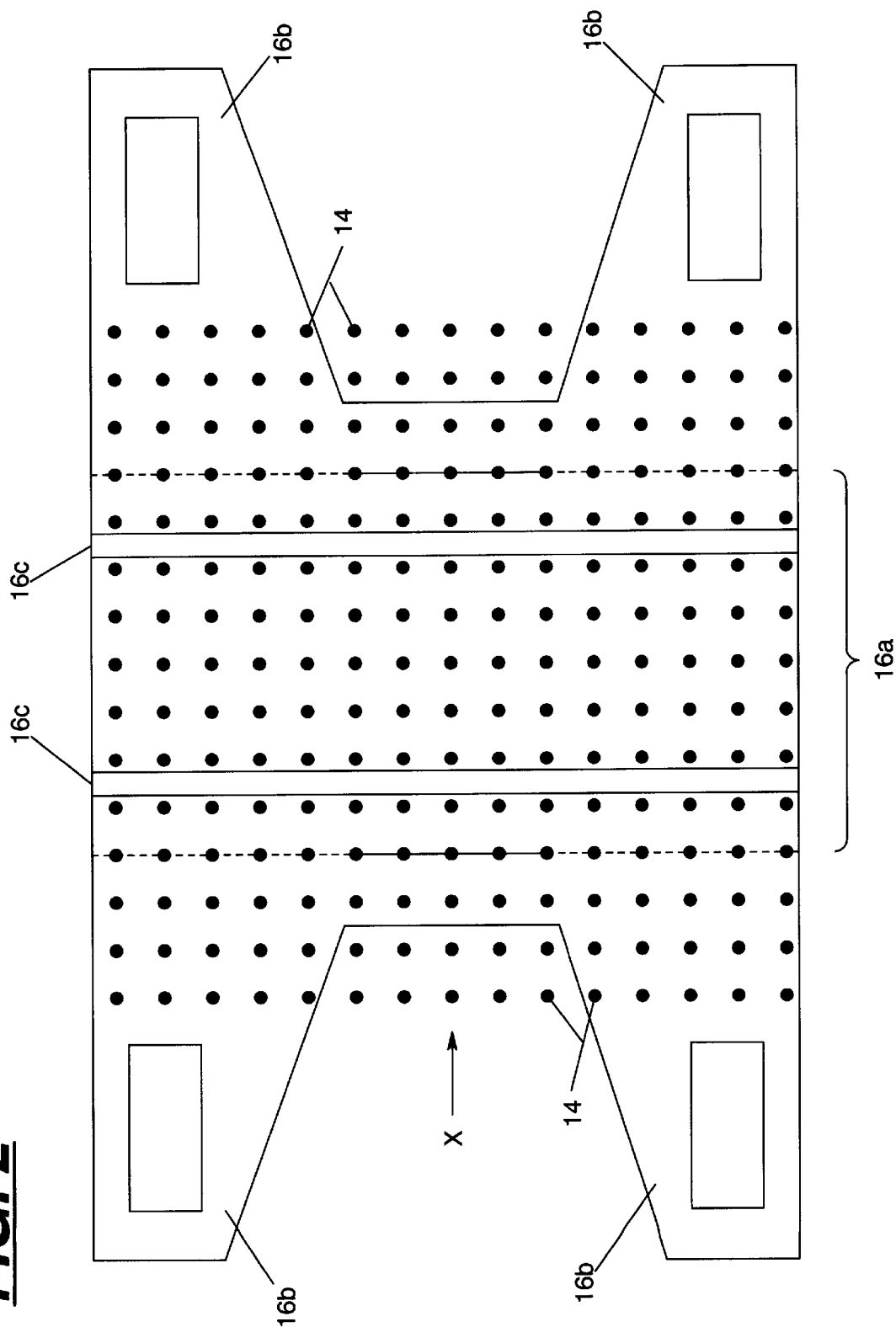

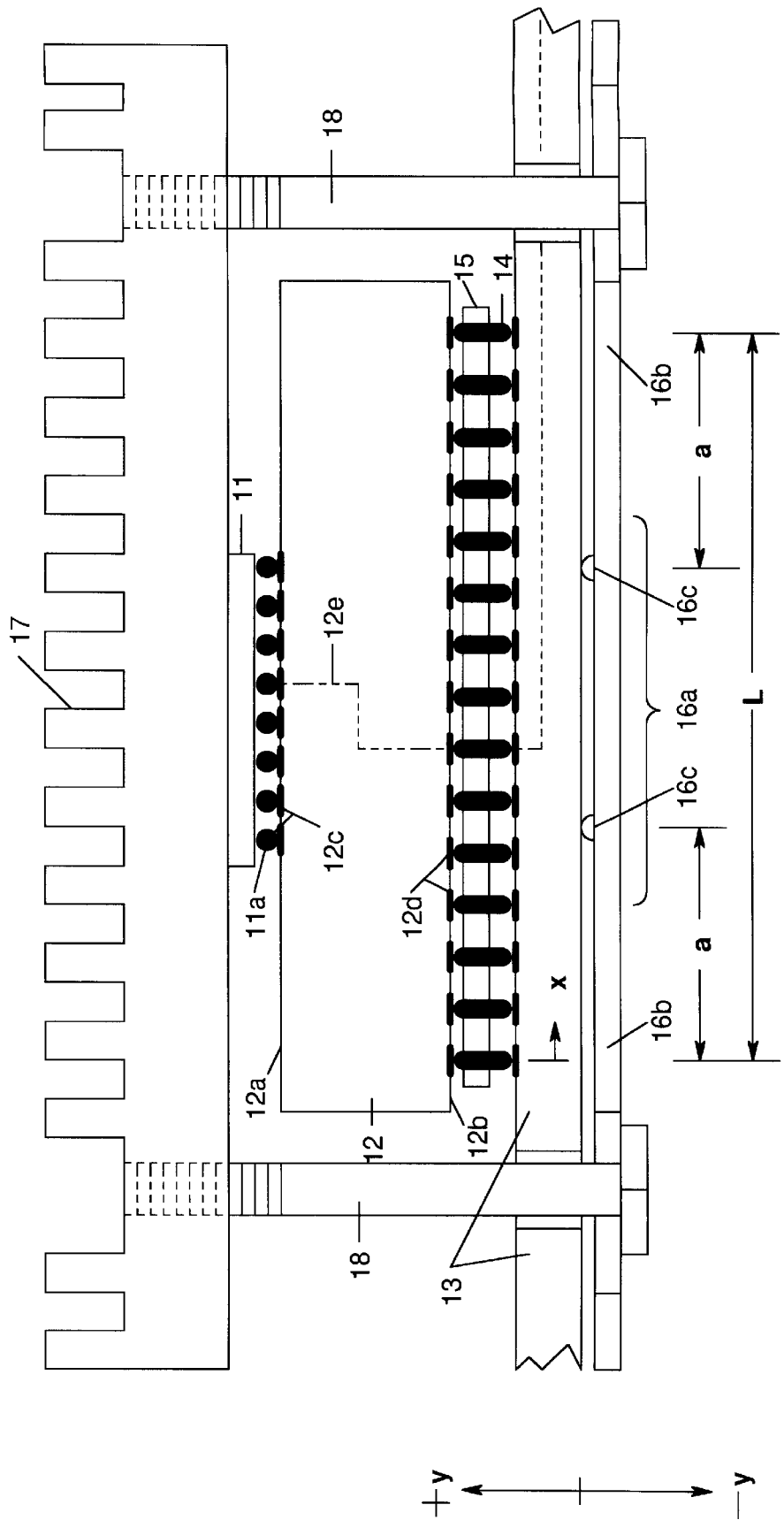

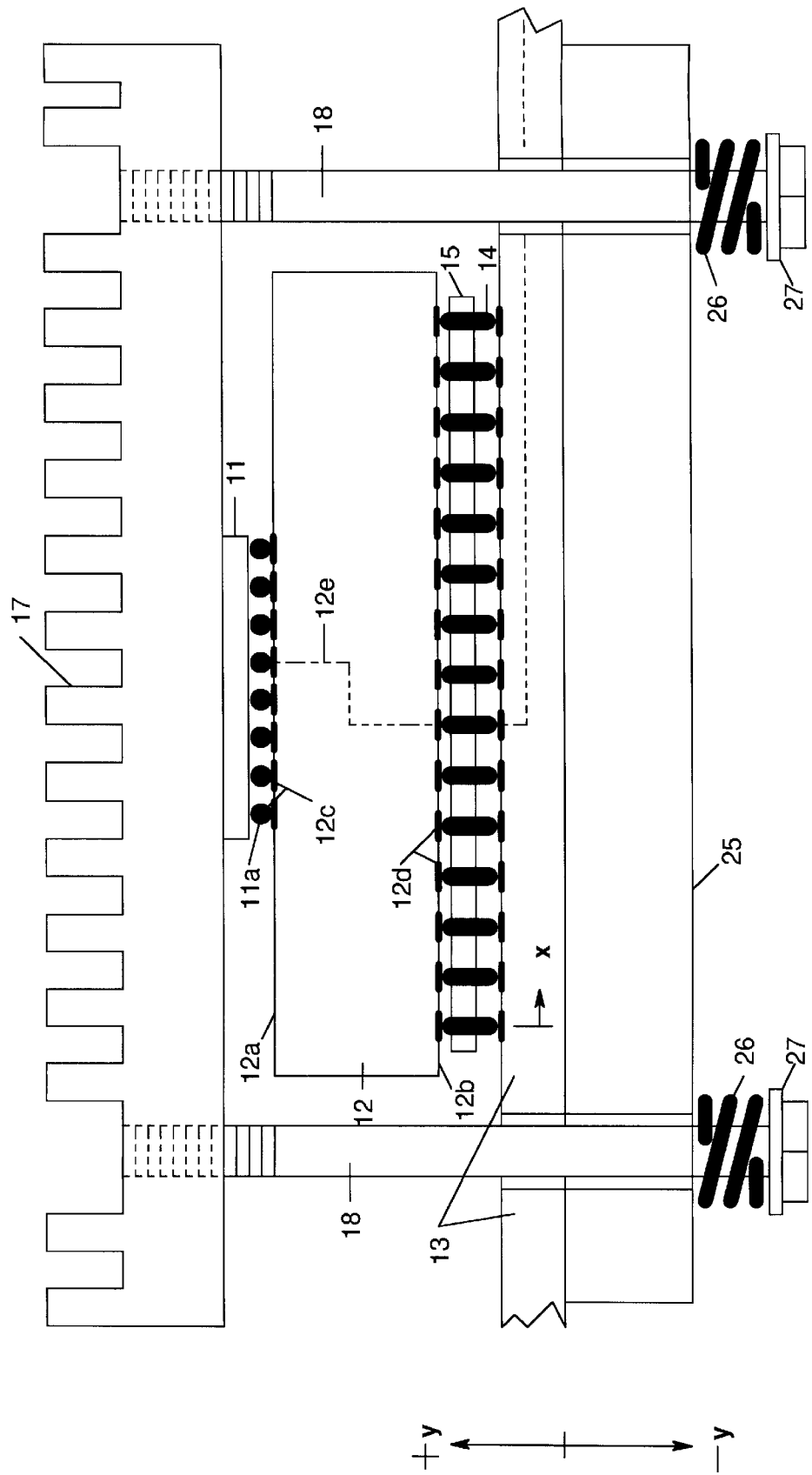

6,042,388

ELECTROMECHANICAL MODULE HAVING A THIN SPRINGY PLATE FOR ESTABLISHING PRESSED ELECTRICAL CONNECTIONS

BACKGROUND OF THE INVENTION

This invention relates to integrated circuit modules of the kind which include pressed electrical connections between two components.

In the prior art, an example of an integrated circuit module that uses pressed electrical connections is disclosed in U.S. Pat. No. 4,999,023 which is entitled "High Density Low Reactance Socket". There, in FIGS. 2A and 2B, a compressible contact is indicated by reference numeral 15. This contact 15 is comprised of a wad of wire that is held by a sleeve 14.

In FIGS. 2A and 2B of patent '023, each contact 15 makes a pressed electrical connection between an input/output pin on a packaged integrated circuit chip and a signal line in a printed circuit board. This electrical connection is made by inserting the input/output pin into the sleeve 14 and pushing against the contact 15. By utilizing such a pressed electrical connection instead of a soldered connection, the packaged integrated circuit chip can easily be removed from the printed circuit board and replaced with another packaged chip.

Each contact 15 which is compressed exerts an opposing force against the input/output pins on the printed circuit board. Thus, as the total number of pressed electrical connections increases, the total opposing force which is exerted against the input/output pins and the printed circuit board also increases.

As a numerical example, suppose that there are a total of 1,000 pressed electrical connections between the packaged integrated circuit chip and the printed circuit board, and that each pressed connection exerts an opposing force of 2 ounces. For that case, the total opposing force against the input/output pins and the printed circuit board is over 100 pounds.

By increasing the total opposing force with which all of the pressed electrical connections exert against the input/output pins and the printed circuit board, a point is eventually reached where the printed circuit board will deflect and bend. Due to that bending, mechanical stress is generated in the printed circuit board; and this stress can damage the board. Also, if the printed circuit board is bent, then all of the compressible contacts do not get compressed by the same amount; and, a contact which is compressed too little can act as an open circuit or high resistance connection.

To keep the maximum deflection of the printed circuit board within an acceptable limit, a stiff-flat plate can be bolted to the printed circuit board. However, in order for a flat plate to be stiff, the plate needs to be thick; and that increases the profile of the module. Increasing the profile is undesirable because that reduces the spacing with which multiple printed circuit boards can be placed side-by-side in an end product.

Accordingly, a primary object of the present invention is to provide an improved electromechanical module which makes pressed electrical connections between an integrated circuit chip package and a printed circuit board in a novel fashion such that deflection and stress in the printed circuit board are kept low without significantly increasing the profile of the module.

BRIEF SUMMARY OF THE INVENTION

In accordance with the present invention, an electromechanical module with pressed electrical connections includes a printed circuit board having a first array of I/O pads, a substrate having a second array of I/O pads that are aligned with and face the first array of I/O pads, and compressible electrical contacts with lie between the first and second array of I/O pads. Also the electromechanical module includes a thin springy plate having a central section which presses against the printed circuit board in line with the first array of I/O pads, and having a springy periphery that extends in a quiescent state away from the printed circuit board. Further the electromechanical module includes a compressing means which compresses the electrical contacts by forcing the substrate towards the printed circuit board while bending the periphery of the thin-springy plate towards the substrate.

With the above electromechanical module, the maximum deflection and stress in the printed circuit board are kept below an acceptable limit by selecting the particular locations where the central section of the thin springy plate presses against the board. In one embodiment, the compressible electrical contacts are arranged in a square array which has a length "L" on each side; and the central plate has a pair of ridges which are offset from two opposing sides of the array by a distance "a", where 0.1<a/L<0.3. By narrowing that range for the a/L ratio, the maximum deflection and stress in the printed circuit board are further reduced.

Also with the above electromechanical module, the thin springy plate is relatively flat when the plate is in a state where the electrical contacts are fully compressed (as compared to the above quiescent state). This flat shape occurs because to compress the electrical contacts, the periphery of the thin springy plate is bent until it nearly touches the printed circuit board. Consequently, the profile of the module is small while the electrical contacts are compressed; and that reduces the spacing with which multiple printed circuit boards can be placed side-by-side in an end product.

BRIEF DESCRIPTION OF THE DRAWINGS

FIG. 1 shows a side view of an electromechanical module, which constitutes one preferred embodiment of the present invention, while the module is in a state where all compressible electrical contacts within the module are uncompressed.

FIG. 2 shows a top view of a thin springy plate which is included in the FIG. 1 module, and it shows how the compressible electrical contacts in the FIG. 1 module are aligned with the thin springy plate.

FIG. 3 shows a side view of the module of FIG. 1, while the module is in a state where all of the compressible contacts within the module are fully compressed.

FIG. 3A shows a side view of a module similar to the module of FIG. 3, which for comparison purposes, includes a thick backplate and coil springs, instead of the thin springy plate in FIGS. 1–3.

DETAILED DESCRIPTION

Figure 4:
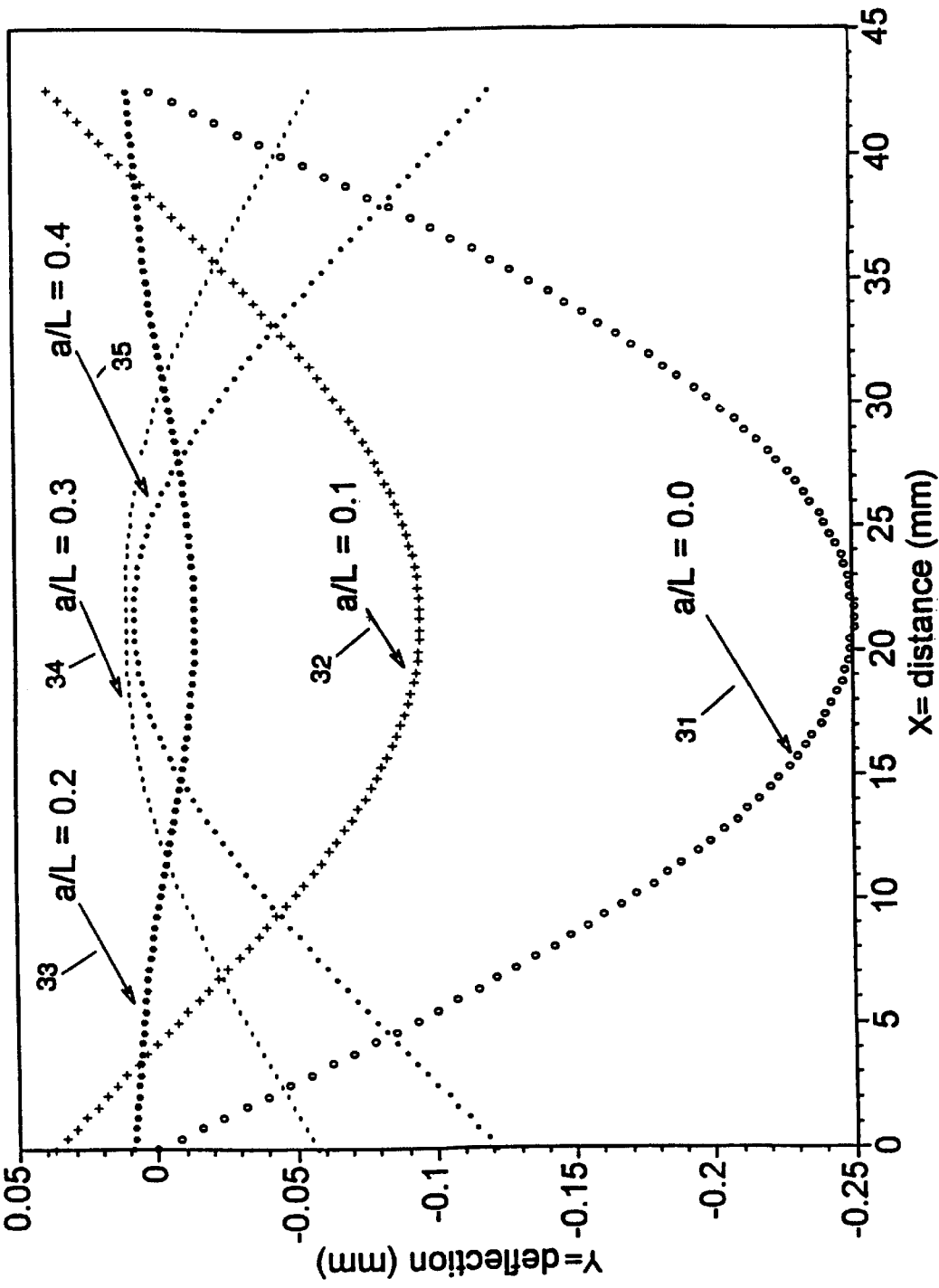
FIG. 4 shows a set of curves which illustrate various deflections that occur in a printed circuit board within the module of FIG. 3, as a function of two parameters "a" and "L".

Referring now to FIG. 1, an electromechanical module 10 which constitutes one preferred embodiment of the present invention will be described in detail. This electromechanical module 10 is comprised of several components 11–18, and each of those components is described below.

Component Description

11 . . . Component 11 is an integrated circuit chip which has multiple input/output terminals 11a. In FIG. 1, the input/output terminals 11a are shown as solder balls as an example.

12 . . . Component 12 is a rigid planar substrate which has a top surface 12a and a bottom surface 12b. All of the input/output terminals 11a of the integrated circuit chip 11 are attached to respective I/O pads 12c on surface 12a of the substrate 12. Within the substrate 12 are a plurality of electrical conductors which connect the input/output terminals 12c to respective I/O pads 12d on the bottom surface 12b of the substrate 12. One such conductor is indicated by reference numeral 12e.

13 . . . Component 13 is a thin bendable printed circuit board, and it has a plurality of I/O pads 13a that align with the I/O pads 12d on the substrate 12. Each I/O pad 13a is connected to a respective electrical conductor which lies within the printed circuit board 13. One such conductor is indicated by reference numeral 13b.

14 . . . Each component 14 is a compressible electrical contact which is squeezed between the substrate 12 and the printed circuit board 13 to thereby make an electrical connection from an I/O pad 12d to an I/O pad 13a. A respective contact 14 is provided for each of the I/O pads 12d. In one embodiment, each contact 14 consists of a wad of wire called a "fuzz button".

15 . . . Component 15 is a carrier which holds all of the compressible contacts 14 such that they are aligned with the I/O pads 12d and 13a. This carrier 15 is made of an electrical insulator such as plastic. The carrier 15 has multiple holes, and the compressible contacts 14 are held in the holes of the carrier as shown in FIG. 1 by friction. Preferably, the contacts 14 in their uncompressed sate extend out of the holes past the carrier 15 by less than one-tenth of an inch.

16 . . . Component 16 is a thin-springy plate which has a flat central section 16a and an adjacent periphery section 16b that extends, in a quiescent state, away from the printed circuit board 13. Two elongated ridges 16c are included in the central section 16a which contact the printed circuit board under the I/O pads 13a.

17, 18 . . . Component 17 is a heat sink which presses against the integrated circuit chip 11 and thereby cools the chip. Each component 18 is a bolt which passes through a respective hole in the thin-springy plate 15 and screws into the heat sink 17. All of the components 17, 18 together constitute a compressing mechanism which compresses the contacts 14.

In FIG. 1, the zigzaggd lines on the left and right sides of the printed circuit board 13 indicate that only a portion of the printed circuit board is shown and that the printed circuit board 13 extends in the left and right directions. Thus, all of the components 11, 12 and 14–18 can be repeated several times on the printed circuit board. In one actual embodiment, the components 11, 12 and 14–18 are repeated thirty times in a 5×6 array on the printed circuit board.

One feature of the FIG. 1 module is that the integrated circuit chip 11 together with the substrate 12 can be easily removed from the module and replaced with another chip on another substrate. This feature occurs because there are no soldered electrical connections between the substrate 12 and the printed circuit board 13. Instead, all of the electrical connections between the substrate 12 and the printed circuit board 13 are pressed connections which are made by the compressible electrical contacts 14.

Turning now to FIG. 2, it shows the compressible electrical contacts 14 and the thin springy plate 16 as viewed in the direction 20 in FIG. 1. From FIG. 2, it is seen that the compressible electrical contacts 14 are arranged in a square array which contains a total of 225 contacts. Also from FIG. 2, it is seen that the flat central section 16a of the thin springy plate 16 is rectangular in shape, and the adjacent periphery section 16b of the thin springy plate consists of four arms. Each arm 16b extends, in a quiescent state, out of the plane of the flat central section and away from the compressible contacts 14 as shown in FIG. 1.

To compress all of the electrical contacts 14, the arms 16b of the thin-springy plate are bent into the plane of the flat central section 16a by screwing the bolts 18 into the heat sink 17. The result of this operation is shown in FIG. 3. Preferably, the bolts 18 are screwed into the heat sink 17 until the arms 16b of the thin springy plate nearly touch the printed circuit board 13. At that point, the thin-springy plate is relatively flat, and the total force which compresses all of the electrical contacts 14 is predetermined and equal to the force which it takes to bend all of the springy arms 16b from their quiescent position in FIG. 1 to their FIG. 3 position.

While the electrical contacts 14 are compressed as shown in FIG. 3, they each exert a force on the printed circuit board 13; and those forces produce deflections in the printed circuit board. However, the magnitude of the deflections in the printed circuit board 13 is greatly effected by the location of the two elongated ridges 16c in the thin-springy plate 16. In FIGS. 1–3, each side of the array of contacts 14 has a length "L", and the ridges 16c are offset from two opposing sides of the array by a distance "a".

To see how the deflections in the printed circuit board 13 vary with the parameters "a" and "L", reference should be made to FIG. 4. There, five curves 31–35 are shown which were generated by a computer simulation of the module 10. Each of those curves 31–35 is plotted on an X-Y axis, where X is shown in FIG. 2 and Y is shown in FIGS. 1 and 3. X is the distance (in millimeters) on a straight line through the center of the printed circuit board 13; and Y is the deflection (in millimeters) of a point on the printed circuit board at distance X. A point at X=0 on the printed circuit board 13 aligns with the left side of the array of contacts 14, and a point at X=42 aligns with the right side of the array of contacts (i.e.—the parameter "L" is 42 millimeters) A deflection of Y=0 corresponds to the position of the printed circuit board 13 while contacts 14 are uncompressed.

Curve 31 in FIG. 3A shows the deflection of the printed circuit board 13 for the ratio of a/L=0. This occurs when the two elongated ridges 16c and the thin-springy plate 16 are aligned with the left and right sides of the array of contacts 14. For that case, curve 31 shows that the printed circuit board 13 has essentially no deflection where it is supported by the two elongated ridges 16c. But midway between those two ridges, the deflection of the printed circuit board 13 has a large maximum value of −0.25 mm.

By comparison, curve 32 in FIG. 3A shows the deflection of the printed circuit board 13 for the ratio of a/L=0.1. This occurs when the two elongated ridges 16c are offset from the left and right sides of the array of contacts 14 by 1/10 of the distance L. Due to that offset, the maximum deflection in the printed circuit board 13 is about −0.08 mm, which is less than half of what it is in curve 31.

Curve 33 shows the deflection of the printed circuit board 13 for the ratio of a/L=0.2. In that case, inspection of curve 33 shows that the maximum deflection in the printed circuit board 13 is again reduced in comparison to the maximum deflections which occur in both the previously described curves 31 and 32 (i.e.—it is about ±0.01 mm).

Curve 34 shows the deflection of the printed circuit board 13 for the ratio of a/L=0.3. In that case, the deflection of the printed circuit boards midway between the two elongated ridges 16c is near zero. However, the deflection of the printed circuit board 13 increases as the distance away from the two ridges 16c increases. Thus the maximum deflection of the printed circuit board 13 occurs in two locations which align with the left and right sides of the contacts 14; and it is larger than the maximum deflection which occurs when a/L=0.2.

Curve 35 shows the deflection of the printed circuit board 13 for the ratio of a/L=0.4. In that case, the deflection of the printed circuit board midway between the two elongated ridges 16c is again near zero, just like it is for curve 34. However, for curve 35, the maximum deflection of the printed circuit board 13 is larger than it is for curve 44.

From the above described curves 31–35, it is seen that the maximum deflection in the printed circuit board 13 can be reduced by limiting the ratio of a/L to a certain range. For example, one such range is 0.1.<a/L<0.3. By narrowing that range, the maximum deflections in the printed circuit board 13 will be further reduced.

One benefit which is obtained with the above-described module of FIGS. 1–4 is that the bending stress which occurs in the printed circuit board 13 can be easily kept below an acceptable limit. This benefit is achieved because bending stress in the printed circuit board 13 generally increases as the maximum deflection of the printed circuit board 13 increases; and the maximum deflection is controlled by limiting the ratio of a/L to a certain range as described above. Keeping the maximum bending stress below an acceptable limit in the printed circuit board 13 is important because as the bending stress increases, the risk of damaging the board increases.

Another benefit of the module in FIGS. 1–4 is that all of the contacts 14 are compressed by nearly the same amount. This benefit occurs because the contacts 14 are compressed in the space between the substrate 12 and the printed circuit board 13; and the uniformity of that space is improved by reducing the maximum deflection in the printed circuit board. If the space is too non-uniform, the contacts 14 in the wide portion of the space will get compressed so little that they will act as an open circuit or high resistance.

Yet another benefit which is achieved with the module of FIGS. 1–4 is that when all of the electrical contacts 14 are fully compressed, the arms of the thin-springy plate are in line with the central portion of the plate. Consequently, the thin-springy plate 16 is relatively flat; and thus, the profile of the entire module is low. This low profile is seen from FIG. 3. Having a low profile module is desirable because it reduces the spacing by which multiple printed circuit boards can be placed side-by-side in an end product.

By comparison, consider a modification where the tin springy plate 16 is deleted and a separate coil spring is added between the head of each bolt 18 and the printed circuit board 13. With that modification, all of the contacts 14 will still be compressed by a predetermined force (which is the force that it takes to compress all the coil springs from their uncompressed state to their fully compressed state); however, this modification has the following two drawbacks.

First, the coil sprigs will increase the profile of the assembly over that which occurs in FIG. 3. Second, the printed circuit board 13 will have a large maximum deflection midway between the bolts 18 as indicated by curve 31 in FIG. 4. To reduce that large maximum deflection, a thick flat plate could be added between the heads of the bolts 18 and the printed circuit board 13 along with the coil springs; and this modification is shown in FIG. 3A. There, the thick flat plate is item 25; each coil spring is item 26; and each item 27 is a washer.

But as FIG. 3A shows, the thick flat plate and the coil springs both increase the profile of the module over that which occurs in FIG. 3. In FIG. 3A, the thick flat plate 25 is more than twice as thick as the thin-springy plate 16; and the height of each coil spring 26 is several times the thickness of the thin-springy plate 16.

Still another benefit of the module of FIGS. 1–4 is that the low profile can be achieved while the thin-springy plate 16 has a small spring rate. With a small spring rate, the contacts 14 are compressed with a force that is predetermined when the arms 16b are bent to their final position where they nearly touch the printed circuit board, regardless of various tolerances in the dimensions of all of the components within the module. In the module of FIGS. 1–4, the spring rate of the thin-springy plate is selected by selecting the thickness of the plate, and the final force with which the contacts 14 are compressed is selected by the spring rate times the distance by which the arms 16b are bent.

One preferred embodiment of the present invention has now been described in detail. In addition, however, various modifications can be made to that preferred embodiment which will now be described in conjunction with FIGS. 5, 6, and 7.

Figure 5:
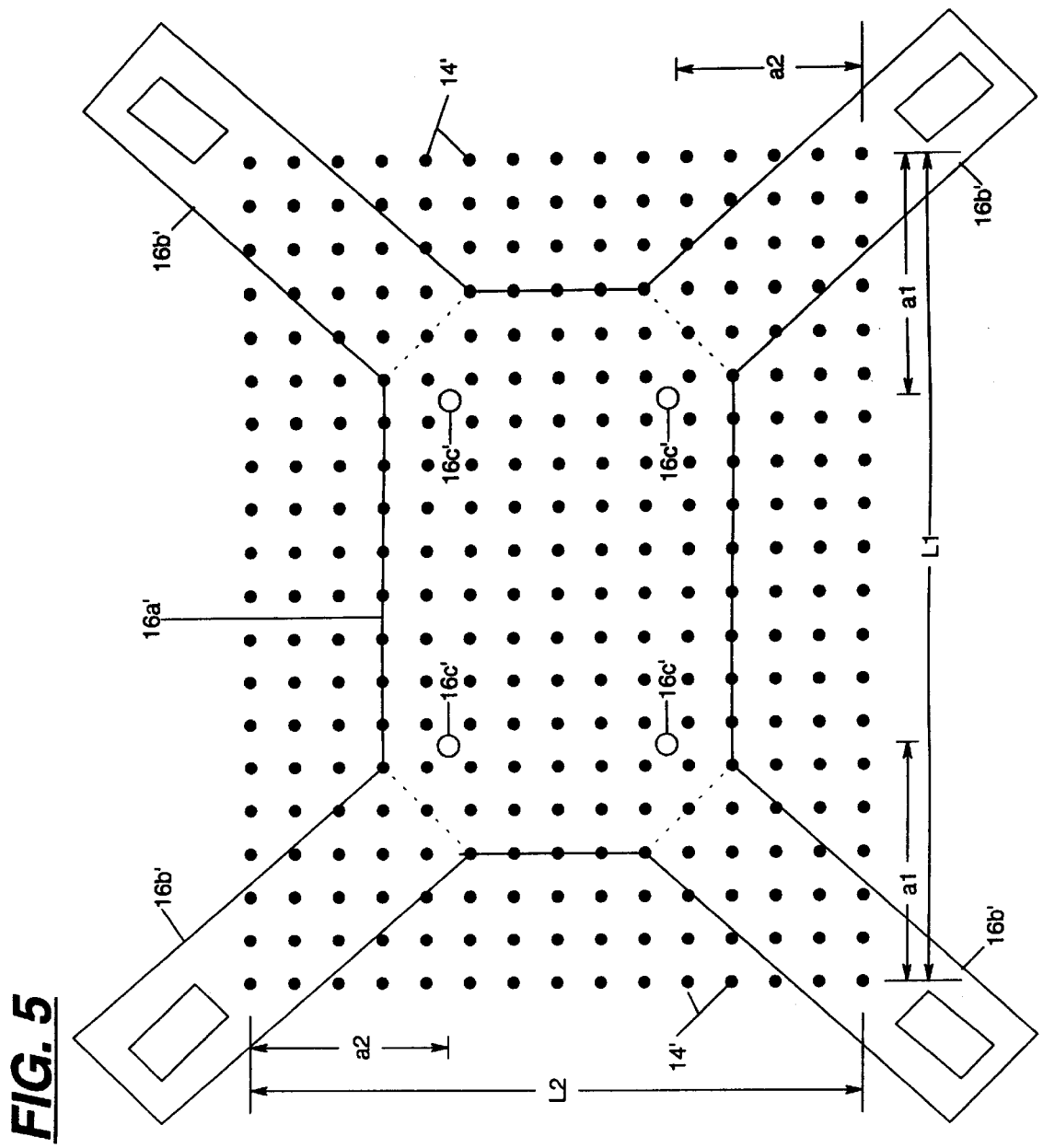
FIG. 5 shows a modification to the module of FIGS. 1—3 wherein the thin springy plate and the array of compressible contacts have different shapes over that which is shown in FIG. 2.

Referring first to FIG. 5, it shows a modification where the array of electrical contacts has a rectangular shape, rather than a square shape as was previously shown in FIG. 2; and this rectangular array of contacts is indicated by reference numeral 14'. Also in FIG. 5, the thin springy plate has a different shape than that which is shown in FIG. 2. This FIG. 5 springy plate includes a flat central section 16a' and an adjacent periphery section of four springy arms 16b'. Each of the arms 16b' extend, in a quiescent state, away from the printed circuit board 13 just like the arms 16b in FIG. 1.

Included in the central section 16a' are four dimples 16c'; and they replace the two elongated ridges 16c in FIG. 2. By placing each of the dimples 16c' at a particular location on the central portion 16a' as shown in FIG. 5, the maximum deflection which occurs in the printed circuit board is limited in the same way that the ridges 16c of FIG. 2 limit the deflections.

In particular, FIG. 5 shows that the left and right sides of the array of contacts 14' are spaced apart by a distance L1, and the dimples 16' are offset from those sides by a distance a1. Likewise FIG. 5 shows that the rectangular array of contacts 14' has top and bottom sides which are spaced apart by a distance L2, and the dimples 16' are offset from those sides by a distance a2. To limit the maximum deflection in the printed circuit board 13, the ratio of a1/L1 preferably is confined to the range of 0.1<a1/L1<0.3 while the ratio of a2/L2 is confined to the range of 0.1<a2/L2<0.3. By narrowing that range for a1/L1 and a2/L2, the maximum deflections in the printed circuit board 13 will be further reduced.

Figure 6:
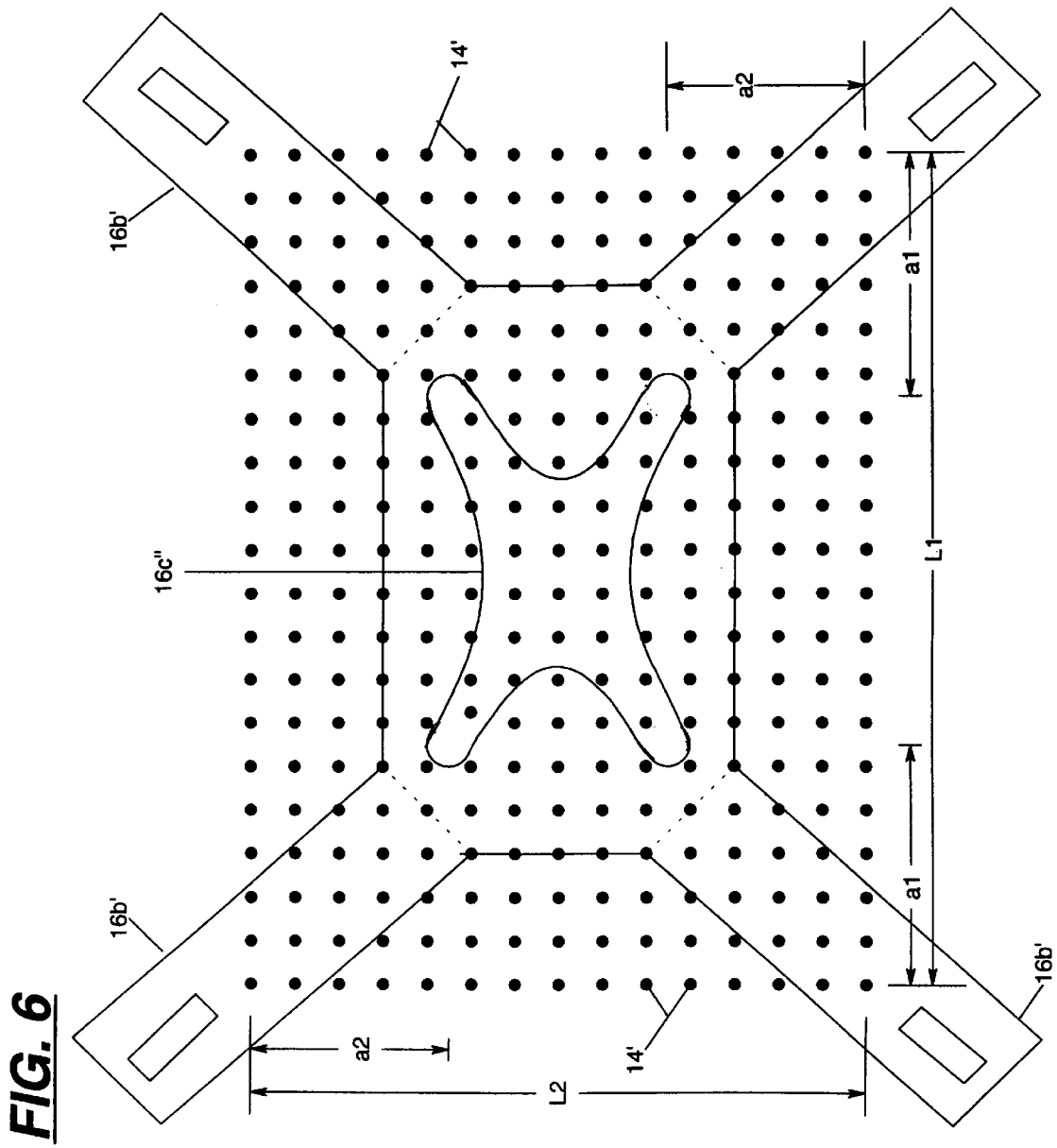
FIG. 6 shows another modification to the module of FIGS. 1–3 wherein the thin springy plate has a different shape over that which is shown in FIG. 5.

Turning now to FIG. 6, it shows a modification to the embodiment of FIG. 5. In the FIG. 6 modification, the four dimples 16c' on the central section of the springy plate of FIG. 5 are replaced with a single continuous indentation 16c". This single indentation 16c" has a perimeter which passes through the same four locations that are defined by the ratios of a1/L1 and a2/L2 in FIG. 5; and that perimeter resists deflections in the printed circuit board 13. Consequently, the single indentation 16c" limits the maximum bending stress which occurs in the printed circuit board 13 in the same way as the four dimples 16c' of FIG. 5 limit the maximum deflection.

Figure 7:
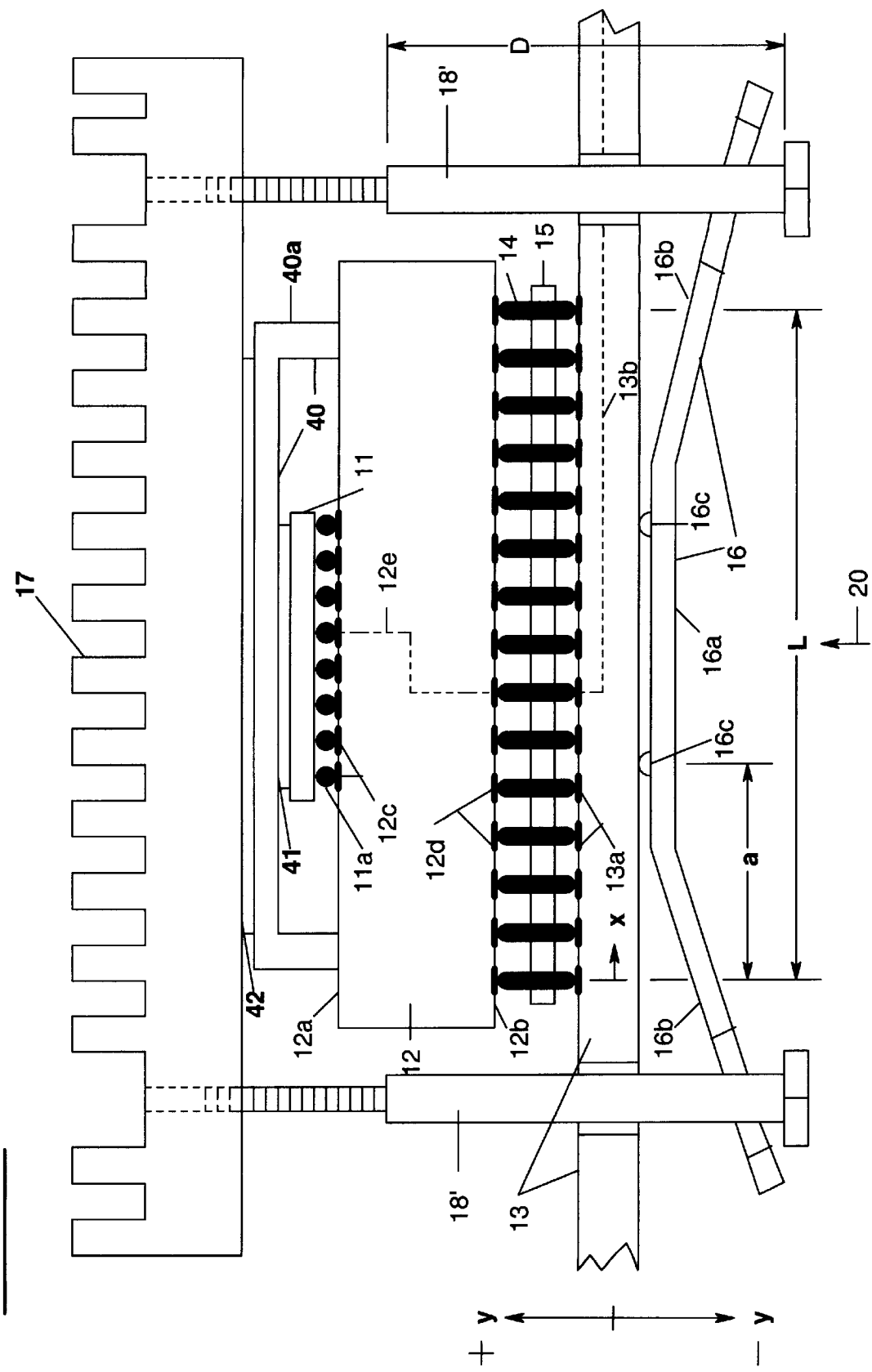
FIG. 7 shows another modification to the module of FIGS. 1–3 wherein the coupling between a heat sink and a substrate in the module is changed.

Next, referring to FIG. 7, it shows a modification which includes all of the components 11–17 that occur in the FIG.

1 embodiment. In addition however, the FIG. 7 embodiment also includes three new components which are a metal lid 40, a layer of a thermal grease 41, and a thermal pad 42; and it includes a modified component, which is each bolt 18'. All of these components are arranged as shown in FIG. 7.

With the FIG. 7 embodiment, the lid 40 has a rim 40*a* which is slightly taller than the height of the integrated circuit chip 11. Consequently, when the bolts 18' are tightened, the heat sink 17 presses against the lid 40; and the rim 40*a* presses against the substrate 12. Since the full force of the bolts is not exerted against the integrated circuit chip 11, the risk of cracking the chip is reduced. At the same time, the thermal grease 41 and the thermal pad 42 eliminate any air gaps between the integrated chip 11 and the heat sink 17; and consequently, the thermal resistance from the chip 11 to the heat sink 17 is low.

Also, with the FIG. 7 embodiment, each bolt 18' has an unthreaded shaft of length D, and that shaft is wider than the threaded end of the bolt. The length D is selected such that the shaft will hit the heat sink 17 when the bolt bends the arms 16*b* of the thin-springy plate to the point where the arms nearly touch the printed circuit board 13. Thus, the wise shaft of length D acts as a stop which prevents the bolts from being further tightened when the contacts 14 are compressed with just the right amount of force.

As another modification, consider a module in which some of the electrical conductors 13*b* in the embodiment of FIGS. 1, 3, and 7 lie on the surface portion of the printed circuit board 13 where contact is made with the thin springy plate 16. In that case, a coating of an electrical insulator can be added to the thin springy plate 16 and/or the printed circuit board 13 to prevent electrical shorts between them.

Also, as another modification the contacts 14 can be incorporated into the module of FIGS. 1 and 8 in any pattern and in any number; and those contacts can be compressed with any desired force. Generally, in an actual module, the total number of contacts 14 is at least two-hundred; and the contacts are compressed with a total force of at least twenty pounds.

Accordingly, in view of the above-described embodiments and modifications, it is to be understood that the present invention is not limited to the details of any one particular embodiment/modification but is defined by the appended claims.

What is claimed is:

1. An improved electromechanical module, with pressed electrical connections, which is comprised of:

a printed circuit board having a first array of I/O pads, a substrate having a second array of I/O pads that are aligned with and face said first array of I/O pads, and compressible electrical contacts which lie between said first and second arrays of I/O pads;

a thin-springy plate having a central section which is parallel to said printed circuit board and having a springy periphery that extends, in a quiescent state, away from said printed circuit board; and, a compressing means which compresses said electrical contacts by bending said springy periphery of said thin-springy plate towards said substrate; characterized in that said printed circuit board is unsupported by any flat-stiff member and is so thin that it is deflected by said array of compressed electrical contacts;

said central section of said thin-springy plate has projections that push directly against said printed circuit board but only at selected locations which are inside the perimeter of said array of compressed electrical contacts; and, said module has a thickness, when said electrical contacts are compressed by said thin-springy plate and said compressing means, which is substantially the same as said module with said thin-springy plate and said compressing means removed.

2. A module according to claim 1 wherein said electrical contacts, as compressed by said compressing means, cause various deflections in said printed circuit board, and wherein said thin-springy plate has a thickness which is less than half the thickness of a modified plate which is completely flat and so thick that it does not increase the maximum deflection in said printed circuit board.

3. A module according to claim 1 wherein said electrical contacts are compressed by said bending of said periphery with a force of at least twenty pounds.

4. A module according to claim 1 wherein the total number of said electrical contacts between said printed circuit board and said substrate is at least two-hundred.

5. A module according to claim 1 wherein said compressing means includes only rigid members and no springs.

6. A module according to claim 1 wherein said compressing means includes bolts which pass through holes in said printed circuit board and are turned to bend said periphery of said thin-springy plate towards said substrate while forcing said substrate towards said printed circuit board.

7. A module according to claim 6 wherein said bolts include stops which prevent said bolts from being further tightened when the periphery of said thin-springy plate is bent to where it nearly touches said printed circuit board.

8. A module according to claim 1 wherein an integrated circuit is attached to said substrate, and said compressing means has legs that push directly on said substrate without touching said integrated circuit.

9. A module according to claim 1 wherein an integrated circuit is attached to said substrate, and said compressing means forces said substrate towards said plate by pushing on said integrated circuit.

10. A module according to claim 1 wherein said projections on said central section of said plate are two elongated ridges.

11. A module according to claim 10 wherein said first array has a pair of sides that are separated by a distance "L", and said two elongated ridges contact said printed circuit board at spaced-apart locations that are offset from said sides by a distance "a" where $0.1 < a/L < 0.3$.

12. A module according to claim 1 wherein said projections on said central section of said plate are four dimples.

13. A module according to claim 12 wherein said first array has one pair of sides that are separated by a distance "L1" and another pair of sides that are separated by a distance "L2", and said four dimples contact said printed circuit board at spaced-apart locations that are offset from said sides by distances "a1" and "a2" where $0.1 < a1/L1 < 0.3$ and $0.1 < a2/L2 < 0.3$.

14. A module according to claim 1 wherein said projections on said central section of said plate are a perimeter around a single contiguous recessed area.

15. A module according to claim 14 wherein said first array has one pair of sides that are separated by a distance "L1" and another pair of sides that are separated by a distance "L2", and said single continuous recessed area is offset from said sides by distances "a1" and "a2" where $0.1 < a1/L1 < 0.3$ and $0.1 < a2/L2 < 0.3$.

* * * * *